United States Patent
Schröder et al.

[11] Patent Number: 6,071,400
[45] Date of Patent: Jun. 6, 2000

[54] METHOD AND DEVICE FOR THE ELECTROCHEMICAL TREATMENT WITH TREATMENT LIQUID OF AN ITEM TO BE TREATED

[75] Inventors: Rolf Schröder, Feucht; Reinhard Schneider, Cadolzburg; Lorenz Kopp, Altdorf; Thomas Rydlewski, Nürnberg; Horst Steffen, Geldern, all of Germany

[73] Assignee: Atotech Deutschland GmbH, Germany

[21] Appl. No.: 09/162,659

[22] PCT Filed: Mar. 26, 1997

[86] PCT No.: PCT/EP97/01544

§ 371 Date: Jul. 16, 1997

§ 102(e) Date: Jul. 16, 1997

[87] PCT Pub. No.: WO97/37062

PCT Pub. Date: Oct. 9, 1997

[30] Foreign Application Priority Data

Mar. 29, 1996 [DE] Germany ................ 19612555

[51] Int. Cl.⁷ ................................. B23H 5/00
[52] U.S. Cl. .............. 205/686; 205/687; 205/125; 204/198; 204/226
[58] Field of Search ................ 205/125, 686, 205/687; 204/198, 226

[56] References Cited

U.S. PATENT DOCUMENTS 4,093,520  6/1978  Koontz et al. .
4,359,366  11/1982  Eidschun .
5,114,558  5/1992  Kadija .
5,194,126  3/1993  Packalin .................. 205/663

FOREIGN PATENT DOCUMENTS 41 23 985   1/1993  Germany .
43 37 988   5/1995  Germany .
62-136813   5/1987  Japan .

*Primary Examiner*—Arun S. Phasge
*Attorney, Agent, or Firm*—Paul & Paul

[57] ABSTRACT

The invention relates to a method and device for the electrochemical treatment of electrically mutually insulated, electrically conductive areas on an item to be treated by means of a treatment liquid. Insulated, for example etched structures on circuit boards cannot be treated electrochemically with known methods since there exists no electrical connection to the bath current source from individual areas. According to the invention, this connection is produced by brushes which touch the structured surfaces to be treated with their electrically conductive and thin fibres. A large number of brushes which are arranged transversely to the direction of transportation take care of the fact that all the electrically conductive areas on the item to be treated which are arranged in an insulated manner from one another are contacted electrically at least one after another and that the achieved contact time is sufficiently long. Counter-electrodes, which may be also designed as movable brushes, are situated preferably between the brush electrodes. In electrochemical processes, in which metal is deposited, the brushes are deplated cyclically. For this purpose, various possible solutions are proposed.

18 Claims, 3 Drawing Sheets

METHOD AND DEVICE FOR THE ELECTROCHEMICAL TREATMENT WITH TREATMENT LIQUID OF AN ITEM TO BE TREATED

This application is a National Stage Application of PCT/EP97/01544 filed Mar. 26, 1997.

The invention relates to a method for the electrochemical treatment of an item to be treated with treatment liquid and also to a device for carrying out the procedure.

In order to produce circuit boards, conductive structures, the conductor lines, must be formed on their surfaces. The latter represent mutually insulated islands which can be treated selectively.

The structures on the item to be treated, for example on circuit boards, must have, however, an electrically conductive connection respectively to the bath current source during treatment since electrochemical treatment of an item to be treated fundamentally presupposes that the surfaces to be treated are electrically conductive. In known electrochemical methods for treating structures on circuit boards therefore, a completely electroplated and, if necessary, through hole plated circuit board which is electrolytically reinforced with copper is assumed. The structures are deposited onto the circuit boards, which are so prepared, by printing or in a photographic manner, for example, with a negative image of the structure. Subsequently, the non-masked, electrically conductive surfaces are treated electrochemically in a selective manner. As a rule, several procedural steps are required here. Finally, the electrically conductive layer between the structures must be completely removed by etching. The etching process is performed preferably in chemical baths using splashing and spraying techniques.

A disadvantage in this procedure is that the item to be treated must be placed twice into a wet-chemical treatment production line: firstly, the circuit boards are through hole plated. Then, the boards are printed with the structure image out with the wet area and subsequently they are inserted once again into a wet-chemical treatment production line for treating the structures. Corresponding rinsing and drying processes are necessary. Furthermore, it is disadvantageous that the conductive base layer between the structures cannot be removed until the conductor lines have been manufactured. For this purpose, the surfaces of the conductor lines must be provided with additional protection so that they are not damaged during the etching process.

The same is true for the production of inner layers of multi-layer courses. In order to prevent two-fold insertion into the wet-chemical treatment production lines (electrochemical all-over treatment of the surface, removal, printing and subsequently further treatment with wet-chemical methods), the untreated holohedral copper surfaces can also be printed first. Then the etching process and the further selective surface treatment can be carried out in a chemical manner. The remaining copper surfaces, which represent electrically insulated islands after etching, are oxidised brown or black in order to improve the adhesion while pressing several inner layers of this type by known methods onto the surfaces. Subsequently, the surfaces are chemically reduced to improve the corrosion properties. These chemical processes are time-consuming and very expensive as a consequence of a continual high consumption of chemicals and the disposal of large amounts of spent chemicals. In contrast, the electrochemical processes for oxidisation or reduction of the copper surfaces have considerable advantages when compared to purely chemical treatment.

In the publication DE 43 37 988 A1, a method for producing multi-layer inner layers is described. It is suggested here, that the oxidised copper surfaces be electrochemically reduced in a horizontal through-put unit. A salt solution, for example, should be used as an electrolyte. The oxidised surfaces are electrically contacted with cathodic polarity via one or two pairs of rollers per multi-layer layer, while the structures are joined electrically to the bath current source via the rollers. The anodes are arranged in such a way that the item to be treated can be directed through between the latter. By means of electrolysis, hydrogen in atomic form, which reduces the copper oxide, appears at the cathodically polarised surfaces of the item. The cost hereby is small in comparison to chemical reduction.

The disadvantage in this procedure is that the contact time on the rollers during the through-put is very small. A conductor line or an insulated land for soldering with a measurement of one millimeter is contacted in the direction of transportation of the circuit boards only for a very short spell of about 0.06 seconds at a transportation speed of 1 m/min. This short time span is however far too small for electrochemical treatment. Other conductor lines on the circuit membrane which are aligned parallel to the direction of transportation have, in accordance with their length, an essentially longer contact time. The result is that the effective treatment time is dependent upon the alignment of the structures on the item to be treated. Furthermore, it is disadvantageous that the contact rollers must be constructed very precisely to be able to contact all the mutually insulated copper surfaces along the surface line and hence to treat them. With a cathodic connection of the rollers furthermore, the latter are inclined to collect impurities which adhere in part very firmly. Consequently, the uniform contacting of the item to be treated is further hampered. If an electroplating process is the electrochemical procedure used here, the rollers are likewise very strongly electroplated so that a continuous operation is not possible using this method.

The roller contact is then also fundamentally inappropriate if the structures are to be only partially electrochemically treated. In this case, the surfaces which are not to be treated are masked with a solder resist. Then, the deeper lying surfaces to be treated cannot be reached by the contact rollers.

Another method and a device suitable therefor is known from U.S. Pat. No. 5,114,558. In this publication a device is described for producing fine conductor lines on circuit boards at a small spacing from one another. This device contains, in an embodiment for contacting conductor lines, a multiplicity of brush fibres which are arranged in two planes and which abut on both sides of the circuit boards at a vertical orientation to the direction of transportation. These brushes are connected to a current source and are polarised anodically during etching of the structures from dead flat laminate. A counter-electrode is provided on the other side of the brush arrangement, as seen from the plane of the circuit board, which is likewise connected to a current source and cathodically polarised in the shown arrangement. However, this device is not suited to performing an electrochemical treatment of the electroplated surfaces on the circuit boards with sufficiently high currents since the counter-electrode is completely screened by the brushes. It can even be supposed that, with this arrangement, absolutely no electric current can be produced on the circuit boards. It is rather the case that all the electrochemical processes take place within a gap between the counter-electrodes and the brushes.

In the further publication, DE 41 23 985 C2, a device is presented for the electrolytic treatment of circuit boards especially for the electrolytic treatment with copper. In order to solve the problem described there that normally electrolytically deposited metal is formed at the contact point to the circuit boards, it is likewise proposed that brushes be used for contacting the circuit boards. These brushes are installed at the edge of the circuit board surfaces to form an electrical contact between the current source and the circuit board, which had been coated with dead-flat metal layers. Certainly, the possibility does not exist either with this device of contacting electroplated areas of the circuit board surface, which are insulated from one another electrically.

Therefore, the problem underlying the present invention is to avoid the disadvantages of the state of the art and in particular to provide an appropriate method and a device for the electrochemical treatment of areas, which are mutually electrically insulated and electrically conductive, on an item to be treated, especially on circuit boards by means of treatment liquid. Above all, the method and device should be suited to treating circuit boards in through-put units in which the circuit boards are maintained in a horizontal or vertical position and to making possible a treatment of structures, which consist of very small insulated surfaces, and/or only a partial treatment of electrically conductive structures. An essential aspect of the invention concerns in addition the problem that, onto the contact elements in electrolytic metal deposition, metal is also deposited on the contact elements so that suitable measures need to be adopted to resolve this problem also.

With the method according to the invention and the device, an item to be treated can be conveyed on a transportation track through the device by means of appropriate transportation devices. Furthermore, further appropriate devices are provided for guiding or containing the treatment liquid which are arranged in such a way that the item, when being conveyed through the device, is brought into contact at least temporarily with the treatment liquid, for example by submerging or soaking. All the mutually electrically insulated and electrically conductive areas on the item to be treated, for example the circuit boards, are brought into contact with stationary brush electrodes, which are supplied from a current source via electrical connections, at least one after another so that an electric potential abuts the areas while the areas are in contact with the treatment liquid. Furthermore, counter-electrodes are provided which are likewise arranged near the transportation track and which are supplied from a current source via electrical connections with reversed polarity and are arranged in such a way that an electric current can flow between the areas and the counter-electrodes. As a result, it is guaranteed that all electrically conductive areas are treated electrochemically one after another with simultaneous contact with the liquid treatment means. It is also possible with the method and device to treat very small electrically conductive areas only partially. Furthermore, with the electrochemical treatment on the brush electrodes, deposited metal can be cleared again from settled metal.

A preferred application of the method according to the invention or a preferred embodiment of the device consists in treating the circuit boards in a continuous manner in a through-put unit. For this purpose, the boards are conveyed through the unit in a horizontal direction of movement by means of appropriate transportation devices, for example rollers or wheels and proceed thereby for example into a bath of treatment liquid or are soaked or sprayed by appropriate devices. The circuit boards can thereby be orientated horizontally or vertically. The brush electrodes and counter-electrodes for the electrochemical treatment are situated preferably on both sides of the transportation track, i.e. for example, above and below the plane of movement. The boards are therefore conveyed through between the electrodes. Of course, the electrodes can also be arranged exclusively on one side of the circuit boards. In order to achieve an optimal distribution of electrical field lines in the space between the electrodes and the transportation track, the brush electrodes and the counter-electrodes are arranged preferably alternately near the transportation track seen from the direction of transportation or another direction so that the counter-electrodes are arranged between the brush electrodes which are arranged adjacent to one another on one side of the item to be treated.

The brushes consist of fine-strand, electrically conductive fibres. They are arranged preferably within the treatment liquid below the bath liquid level and are constructed preferably in the form of rows which are aligned parallel to one another. These rows can be arranged at an angle greater than zero to the direction of transportation of the item to be treated, preferably perpendicular to the direction of transportation and parallel to the transportation track which is constructed preferably in the form of a plane of transportation.

For protection against chemical and electrochemical attacks the brushes consist of resistant materials such as, for example, titanium, niobium, tantalum, noble metals or special steel. The fibres of the brushes, for example with a fibre diameter of 0.01 mm are very elastic. They are very well suited to the surface to be treated. This also makes possible the partial treatment of structures, which lie deeper than the insulating layers near these areas (for example near a solder resist). The fibre bunches reach even the smallest surface regions between these insulations. The fine-strand fibres do not cause any damage to the surfaces to be treated because of their elasticity. In conjunction with a large number of fibres per brush, a long contact time of the individual structures is achieved with a corresponding arrangement of many brushes transversely to the direction of transportation of the item to be treated. The electrochemical treatment is also correspondingly long. In electrochemical processes, in which no metal is deposited, the contact time can be almost 100 per cent because the counter-electrodes can be arranged right beside the brushes. This implies that each insulated structure constantly remains in electrical contact with the bath current source while proceeding through the electrochemical bath despite the spacings of the brush electrodes from one another which is caused by the counter-electrodes. Electrochemical processes of this type are for example electrolytic cleaning, oxidisation, reduction and etching (engraving). Depending on the method used, the brushes and, via the latter, the item to be treated are polarised anodically or cathodically.

The method according to the invention is also particularly suited to those electrochemical processes in which metals are being deposited on the item to be treated. Examples of this are the selective deposition of copper, gold, nickel, tin and also tin/lead-, copper/tin- and copper/zinc alloys on structured circuit boards. Furthermore the method and device are also suited to the fully additive production of circuit boards by electrochemical metal deposition, especially by copper deposition. In electrolytic metal deposition, the brush electrodes are connected cathodically. This means that the electrically non-insulated surface regions of the brushes, as well as the item to be treated, become electroplated. Therefore, from time to time they must be deplated. For the general avoidance of electroplating of the fibres, each individual fibre can be provided with insulation like an insulated fine strand. In order to maintain the elasticity of the fibre and because of the small measurements, enamellings and resistant passive coatings of oxides of the used metals and also coatings applied by means of electrophoretic enamelling are particularly suitable. Only the contact-making tip of the fibre is not covered by insulation in this case. In the deposition process, both soluble and insoluble electrodes can be used as anodes. Insoluble anodes have the advantage that they can be better accommodated to the constructive conditions of the unit.

With methods in which metal is deposited onto the electrically conductive areas, the brush electrodes must be cleared again of metal on a regular basis. In one embodiment, the brushes are removed from the device and cleared of settled metal in a separate device by chemical or electrochemical etching. For this purpose, the brush electrodes must be designed in such a way that they can be readily exchanged. By means of cyclical exchange of the brushes for brushes which have been cleared of metal and by means of deplating of the brushes to be regenerated in separate baths, a continuous operation of the through-put unit can be maintained.

In another embodiment of the invention, the cathodically polarised brush electrodes are electrochemically deplated in the electroplating bath itself. In this case, insoluble anodes are used. At least two brush electrodes in the form of rows, preferably arranged in parallel, are arranged transversely or at any angle to the direction of transportation of the circuit boards. Preferably, these rows extend over the entire width of the transportation track or the width taken up by the item to be treated or at least over the width which is brushed over by the electrically conductive regions. For deplating, individual brush electrodes or rows of brush electrodes are raised from the circuit board surfaces by means of appropriate devices, thus producing a spacing between the electrodes and the transportation track so that they have no more contact with the circuit boards. The brush electrodes thereby change polarity electrically at least for a short while by means of further suitable devices. As a result, a part of the brush electrodes for example operates during electroplating as a cathodic contact for the circuit boards and the other part as insoluble anodes. Furthermore, the brush electrodes which have changed polarity in this situation are also anodically polarised relative to the other brushes. The raised brushes are electrochemically deplated and the other brushes conduct the cathode potential to the surfaces of the structures to be treated. These structures and the just mentioned brushes are electroplated. After a predetermined time, the polarity conditions of the brushes are changed. The electroplated brushes are switched to anodes and the deplated brushes are switched to cathodes. Correspondingly, electroplating and deplating take place. The described exchange cycle of the brushes can take place alternately with many rows of brushes in the unit, so that a long, effective, cathodic contact time is achieved.

The quantity of metal deposited on the circuit board surfaces must be regenerated continuously in the bath. This takes place with known means and methods, for example by adding metallic salts.

In a further variant of the method, the brush electrodes can also be cleared of settled metal by means of a deplating substrate, preferably in the form of a plate which is transported through the unit on the transportation track just like the item to be treated. Those brush electrodes or rows of brush electrodes, past which this plate is transported, are raised individually from the plate surface by appropriate devices and are connected anodically by reversing poles. In order to control this procedure a further device is used with which the transportation of the substrate in the device can be tracked. Depending upon the place respectively where the substrate is situated, the devices are controlled for lifting the brush electrodes and reversing their polarity.

The plate itself is preferably cathodically connected. The metal, which is electrolytically detached from the brushes, is deposited on said plate. While a current source serves for electroplating the circuit boards and is connected to the brush electrodes, which have electric contact to the circuit boards, a further current source can be provided for deplating the brush electrodes which have been raised from the circuit boards and have had their poles reversed. As a result, the current for the deplating can be adjusted independently of the deplating current. In particular, a higher current density can be set in the reversed-pole brush electrodes than in the brush electrodes which are in contact with the circuit boards.

On the other hand, the brush electrodes do not have to be raised from the plane of transportation if the deplating substrate is covered by a diaphragm which prevents an electrical short circuit in the bath current source. In this case also, those brush electrodes, which are preferably designed in the form of rows, are electrically reverse polarised in order to remove settled metal from the item to be treated, especially from circuit boards past which the deplating substrate is transported.

Preferably, the deplating substrate can be conveyed on a continuous track in the device. On one part of the track, the substrate serves for deplating the brush electrodes in the given manner. On another part of the track, preferably on the way back to the starting point of the first part of the track, the deplating substrate itself is once again cleared of the deposited metal either chemically or electrochemically by plunging into an appropriate deplating bath, if necessary, with further electrodes for the electrochemical deplating.

BRIEF DESCRIPTION OF THE DRAWINGS

The method and the device are explained with reference to the schematic FIGS. 1 to 3.

In FIG. 1, there are situated on both sides of the circuit board 1 structures 2 which are to be treated electrochemically, here electroplated. The structures are electrically conductive. They can be created, for example, by etching and have no electrical connection amongst themselves. Hence, contacting of the structures at one single point on the circuit board, as is common with known methods for producing circuit boards, is not possible. The metallic fibres 3 of the brushes 4 serve in the present device for contacting the structures 2. The fibres 3 rest lightly on the surfaces of the structures 2 to be treated. Together with the connection lines 6, they thus produce the electrical connection of the surfaces to the bath current source 7 via the brushes 4. The other pole of the bath current source 7 is connected to the counter-electrode 8. This electrode is situated, electrically insulated, between the brushes 4. The active electrode surface 9 is situated near the electrically contacted structures 2. In FIG. 1, the bath current source is shown polarised in such a way that the device is accommodated for example to the electrochemical deplating of the circuit boards. From time to time, the counter-electrode 8 needs to be deplated. This can take place by means of cyclical electrode exchange, the electrodes of the device being removed and deplated in a separate device. During electrochemical reduction without dissolved metal in the treatment solution, the exchange of brushes is inapplicable since nothing is deposited on them.

In FIG. 2, the brushes 10, 11, 12, 13 are arranged movably. Two brushes respectively are held by one rocker 14. The preferably current-regulated bath current source 7 is polarised here for the brushes 10 and 12 in such a way as is necessary for electroplating. The brushes 10 and 12 thus have cathodic potential via the reversing switch 15. The structures 2 on the circuit board are electrically contacted via said brushes. The brushes 11 and 13, which are raised by the rocker 14, are polarised anodically via the reversing switch 15. They operate as anodes. At the same time they are deplated if they were previously electroplated. In order to focus the electroplating and deplating process on the circuit board and on the fibres of the brushes, there is situated between two brushes respectively a dividing wall 16, which has an electrically insulating effect so that a direct flow of current between the differently polarised brush electrodes is generally prevented.

Figure 1:
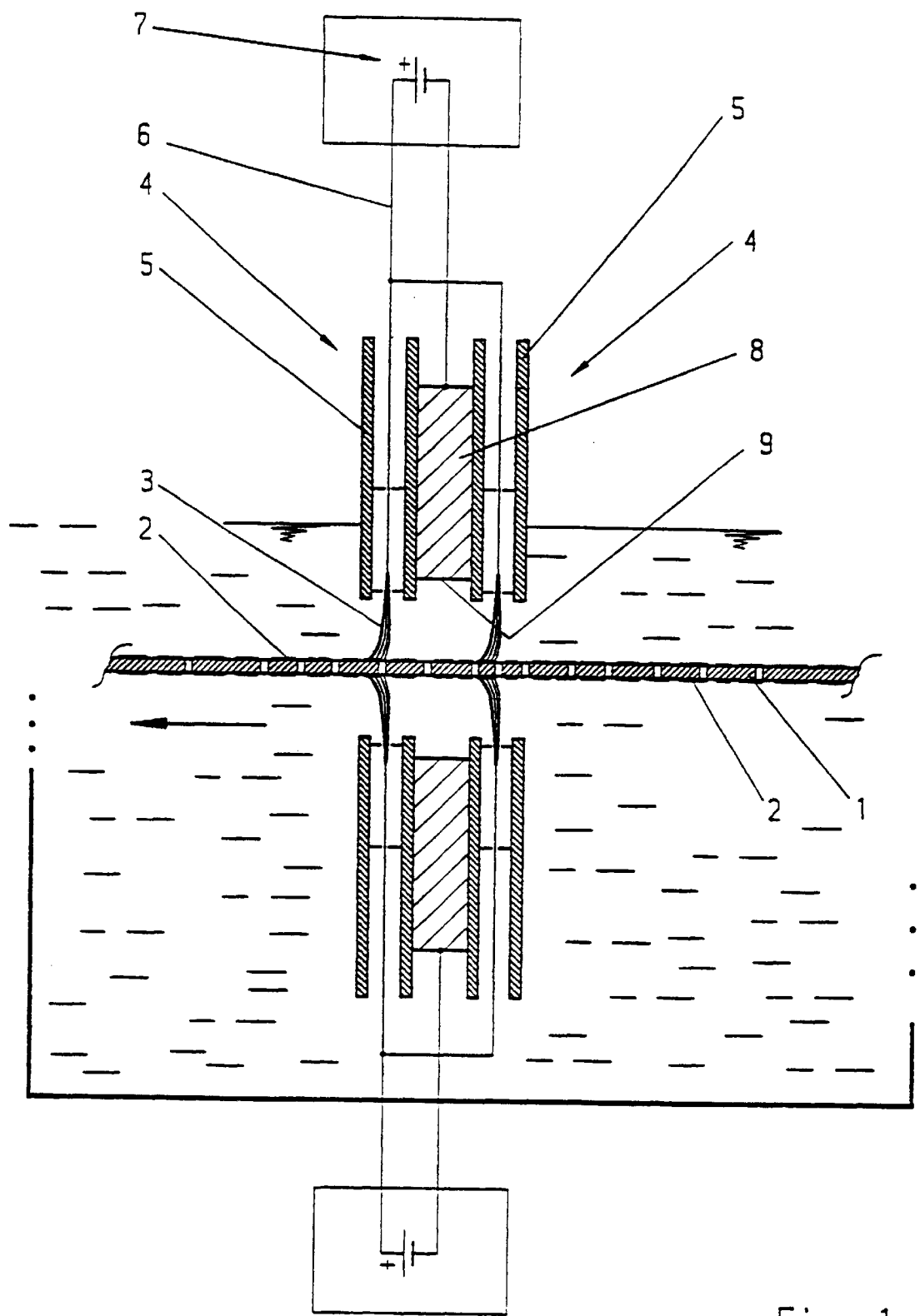
FIG. 1 device with replaceable brush strip with intermediate counter-electrode.
Figure 2:
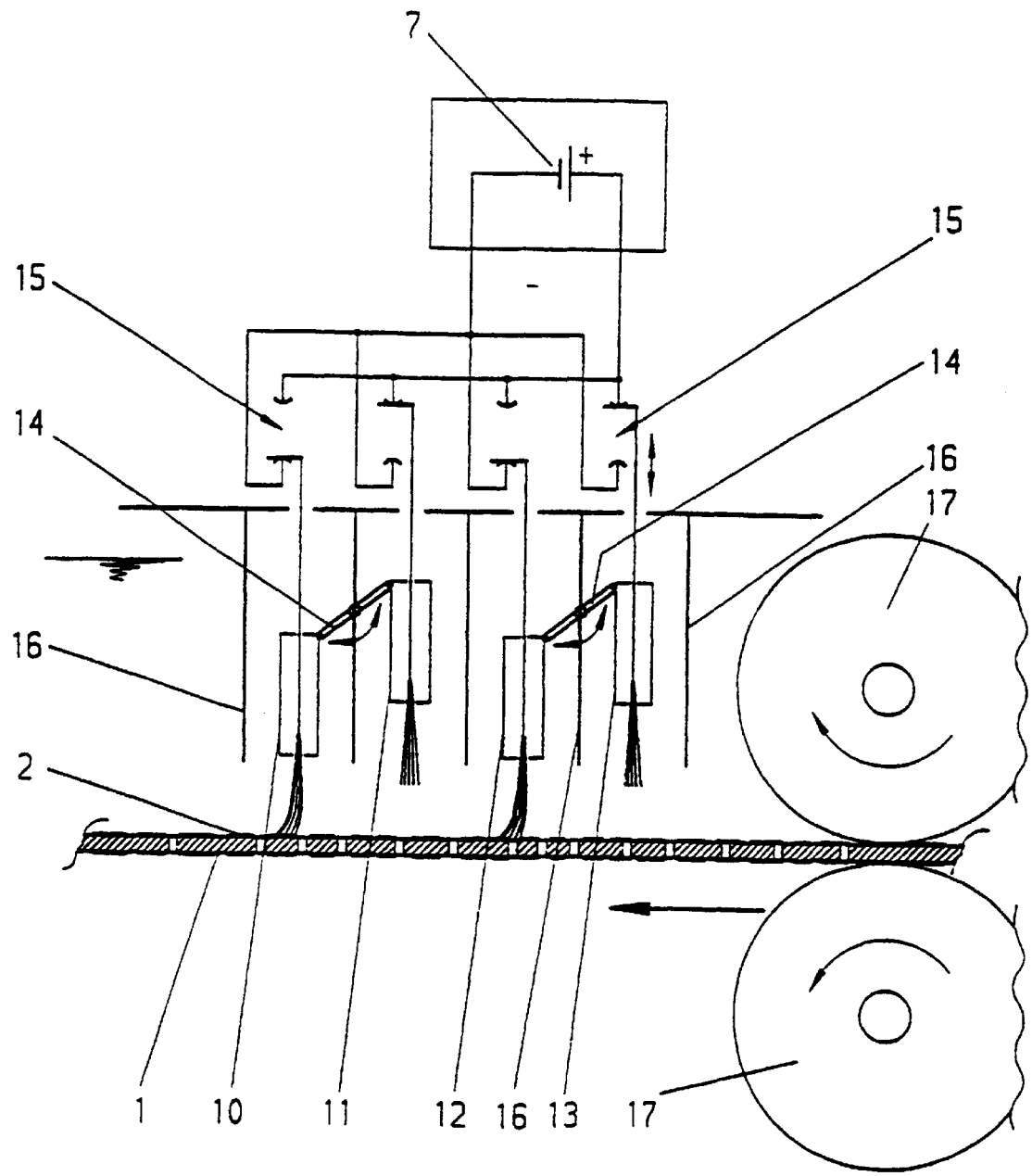
FIG. 2 device with movable brush electrode arrangement for electroplating and deplating in the electroplating cell.

After completion of the deplating of the brushes 11 and 13, the latter are brought to the circuit board surface by means of rockers 14 while, at the same time, brushes 10 and 12 are raised from the surface. The polarity of the brushes changes thereby in accordance with the drawing. In practice, the brushes can be arranged preferably at a smaller spacing than is shown in FIG. 2. The raising and lowering of the brushes can also be carried out by other mechanical means. It is not restricted to rockers. The switching of polarities of the brushes can also be achieved with electronic switches. The transportation rollers or wheels 17 which are known from through-put units are shown only in FIG. 2. Transportation elements of this type can also be used in the devices in FIGS. 1 and 3 to convey the circuit boards through the device along the direction of transportation which characterised by the arrow shown. In addition, rollers can also be used to prevent the escape of treatment liquid situated above the plane of transportation at the inlet to and the outlet from the device.

Figure 3:
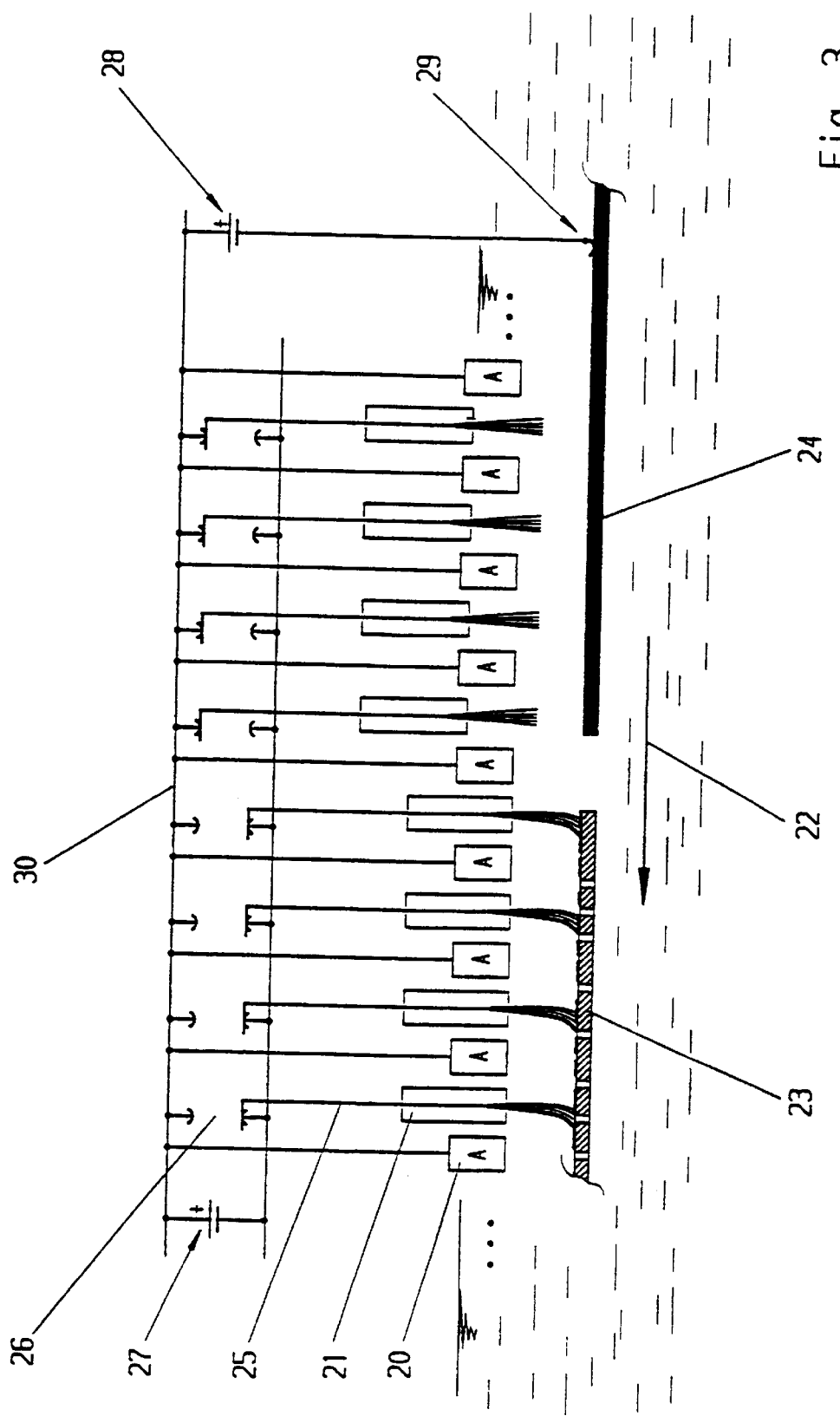
FIG. 3 device with brush electrode arrangement and deplating plate.

In FIG. 3, a further embodiment of the invention is shown. Anodes 20 and brushes 21 are arranged alternately in the through-put direction of the item to be treated. They extend transversely to the direction of transportation, which is indicated by the arrow 22, over the entire unit so that all the structures present on the circuit boards are conveyed past the brushes and counter-electrodes. The brush electrodes 21 are movable. They can be raised individually, by a drive not shown, from the circuit board 23 to be treated or from a metallic deplating plate 24. The brushes 21 are raised above the plate 24 as it passes through. Fibres of the brushes resting on the circuit board 23 produce the electric connection from the structures to be treated via connection lines 25 to the reversing switch 26. Via the latter, the negative pole of the bath current source 27 is connected momentarily to the electroplating brushes. The electroplating current is set automatically in accordance with the selected current density relative to the number of cathodically connected brushes respectively. For this purpose, the item to be treated, the circuit board 23 or the circuit boards are tracked by the control system of the through-put unit. Switching the brushes on and off occurs individually in temporally correct sequence. The brushes can be connected in a similar manner just as is described in the Patent document DE 39 396 81 C2 for connecting anodes in through-put units. With respect to the type and the conduct of this control system, reference is made to this publication.

The anodes 20 are preferably insoluble. The metal dissolved in the electrolyte is deposited not only on the structures of the circuit board 23 but also on the fibres or fibre points of the brushes. They must be deplated from time to time. In FIG. 3, the transition from electroplating to deplating is represented. For deplating, the brushes 21 are raised and placed simultaneously via reverse switch 26 on an anodic potential. The second current source 28, which can be set individually, serves for depleting. The negative pole of the current source 28 is connected electrically to the deplating plate 24. In order to contact the deplating plates 24 which are to be transported like the circuit boards through the unit, sliding contacts 29 or clamps are used as are known from horizontal electroplating through-put units.

The metal, which is located on the fibres of the brushes, is deposited down onto the deplating plates 24. In practice, the brushes operate till the metal is completely detached as soluble anodes which require a smaller bath voltage than the insoluble anodes by about 0.8 volts to dissolve the metal. The result is that the insoluble anodes 20 do not start up on account of the potential being too low for them and do not conduct any electroplating current. After complete removal of the metal from the fibres, the latter likewise represent insoluble anodes. The anode current then drops to a value of approximately zero. This circumstance can be used for introducing the reversal of the brushes. If soluble anodes 20 are used it is practical to separate the latter electrically from the positive potential of the bar 30 by means of a switch not shown if deplating is in progress in this region.

The deplating plate 24 and the sliding contacts 29 or clamps can be deplated chemically or electrochemically in the run-back to the unit loader. The plates can be delivered also to a metal recycling plant elsewhere.

In a particular development of the invention, the raising of the brushes 21 during deplating can be omitted. In order to avoid a short circuit in the bath current source 28, the deplating plate 24 is covered on all sides by a thin electrically non-conductive diaphragm. Apart from here, only the side regions are for contacting the plate.

These regions are not touched by the brushes. The diaphragm may be a chemically resistant cloth. A textile made of polypropylene for example is very suitable for this purpose. The anodically connected brushes are deplated via the diaphragm. The deplating process is highly effective on account of the particularly small anode/cathode spacing. This permits the length of the momentary deplating section to be kept short in comparison to the electroplating section. The deplating plates which are covered by the diaphragm are likewise deplated right through the diaphragm in a separate part of the transportation track. This deplating can preferably be performed also electrochemically.

In order to treat the circuit boards on both sides, the device in FIG. 3 can also be built laterally reversed.

We claim:

1. Method for the electrochemical treatment of electrically mutually insulated, electrically conductive areas on an item to be treated by means of a treatment liquid in which
   a. the item to be treated is conveyed through the device on a transportation track by means of transportation devices and is thereby brought into contact at least temporarily with the treatment liquid;
   b. all electrically conductive areas on the item to be treated are brought into contact at least one after another with stationary brush electrodes which are supplied by a current source so that an electrical potential abuts on the electrically conductive areas while the areas are also placed in contact with the treatment liquid;

c. in which furthermore counter-electrodes which are likewise supplied by the current source with reverse polarity are provided in the vicinity of the transportation track and arranged in such a way that an electrical current can flow between the electrically conductive areas and the counter electrodes, characterised in that between the brush electrodes and the counter-electrodes, electrically insulating separation means respectively are arranged in order to prevent a direct flow of current between the counter-electrodes and the brush electrodes.

2. Method according to claim 1, characterised in that the brush electrodes are cleared again of metal which has settled during treatment.

3. Method according to claim 2, characterised in that in order to remove settled metal, individual brush electrodes are raised from the transportation track and thereby the poles are changed electrically.

4. Method according to claim 3, characterised in that a deplating substrate is transported through the device on the transportation track and a spacing is produced between the transportation track, and those brush electrodes, past which the deplating substrate is transported, are thereby reversed in polarity.

5. Method according to claim 2, characterised in that a deplating substrate, covered with a diaphragm, is transported through the device on the transportation track and those brush electrodes, past which the deplating substrate is transported, are thereby electrically reversed in polarity for removing settled metal.

6. Method according to one of claims 4 and 5, characterised in that the deplating substrate, in with respect to the reverse polarised brush electrodes, is polarised cathodically.

7. Method according to one of claims 4 and 5, characterised in that the deplating substrate is conveyed on a continuous track in the device, the substrate being guided on one part of the track for deplating the brush electrodes and on another part being itself deplated again.

8. Method according to one of claims 3 and 5, characterised in that a high current density is set in the brush electrodes when the latter are reversed in polarity.

9. Method according to claim 2, characterised in that the brush electrodes are cleared again of settled metal by removing the brush electrodes from the device and by subsequent chemical or electrochemical etching of the metal from the brush electrodes.

10. Device for the electrochemical treatment of electrically mutually insulated, electrically conductive areas on an item to be treated by means of a treatment liquid a. with devices for transporting of the item on a transportation track through the device;

b. with further devices, for guiding or containing the treatment liquid, which are arranged in such a way that the item comes at least partly into contact with the treatment liquid;

c. in addition, with stationary brush electrodes which are arranged ins such a way that, during transportation of the item on the transportation track, they can be brought into electrical contact at least one after another with all the electrically conductive areas, while the areas also remain in contact with the treatment liquid;

d. with counter-electrodes which are arranged near the transportation track in such a way that an electrical current can flow between the electrically conductive areas and the counter-electrodes and e. with a current source and electrical connections between the current source and the electrodes for providing current to the electrodes, characterised in that f. between the brush electrodes (4,10,12,21) and the counter-electrodes (8,11,13), electrically insulating separation means (5,16) respectively are arranged to prevent a direct flow of current between the counter-electrodes and the brush electrodes.

11. Device according to claim 10, characterised in that the brush electrodes and the counter-electrodes are arranged on both sides of the transportation track.

12. Device according to one of the claims 1 and 11, characterised by further devices for intermittent electrical reversal of polarisation of at least individual brush electrodes and also devices for raising the reverse polarised brush electrodes from the transportation track.

13. Device according to one of the claims 1 to 11, characterised in that the brush electrodes are designed in the form of rows which are aligned parallel to one another, said rows being arranged at an angle greater than zero to the direction of transportation of the item to be treated on the transportation track, which is designed as a transportation plane, and arranged parallel to said track.

14. Device according to claim 13, characterised by devices with which those rows may be raised from the plane of transportation and past which a deplating substrate can be transported in the plane of transportation.

15. Device according to claim 14, characterised by a control system for tracking the deplating substrate through the device and for controlling the devices for raising the brush electrodes and reversing their poles.

16. Device according to claims 1 to 11, characterised by at least two current sources, one of which serves for electroplating the item to be treated and another for deplating the brush electrodes.

17. Device according to one of the claims 1 to 11, characterised in that the counter-electrodes are arranged between brush electrodes which are arranged side-by-side on one side of the item to be treated.

18. Device according to claim 1, characterised in that the brush electrodes are designed so that they can be readily replaced.

* * * * *